(12) United States Patent
Kulhalli et al.

(10) Patent No.: US 6,791,312 B1
(45) Date of Patent: Sep. 14, 2004

(54) MEASURING POWER OF ANALOG SIGNALS

(75) Inventors: Suhas Kulhalli, Karnataka (IN); Shih Tsang Fu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 10/403,079

(22) Filed: Apr. 1, 2003

(51) Int. Cl.$^7$ ............................................. G01R 19/00
(52) U.S. Cl. .................. 324/76.11; 327/58; 702/64; 455/115.1
(58) Field of Search ................ 324/76.11, 630, 324/76.39, 647, 76.12, 142; 702/64; 327/50, 53, 54, 58, 77, 89, 113, 581, 246, 266, 563; 330/301–302; 455/115.1–112.3, 572

(56) References Cited

U.S. PATENT DOCUMENTS

| | | | | |
|---|---|---|---|---|
| 3,531,722 A | * | 9/1970 | Seibold | 455/115.1 |
| 4,218,736 A | * | 8/1980 | Haraguchi | 702/64 |
| 4,295,094 A | * | 10/1981 | Wilreker et al. | 324/96 |
| 6,339,702 B1 | * | 1/2002 | Izumiyama | 455/115.3 |
| 6,356,744 B1 | * | 3/2002 | Zamat | 455/126 |
| 6,404,284 B1 | * | 6/2002 | Johnson | 330/149 |

OTHER PUBLICATIONS

Mohamed Ratni et al, "RF Power Detector Using a Silicon Mosfet", 1998 IEEE MTT-S Digest, pp 1139–1142.
Stacy Ho, "A 450MHz CMOS RF Power Detector", 2001 IEEE Radio Frequency Integrated Circuits Symposium, pp 209–12.

* cited by examiner

*Primary Examiner*—David A. Zarneke
*Assistant Examiner*—Paresh Patel
(74) *Attorney, Agent, or Firm*—J. Dennis Moore; W. James Brady III; Frederick J. Telecky Jr.

(57) ABSTRACT

An original rectifier circuit is used to rectify an input signal and the input signal is coupled to be provided to a terminal of a amplifier. The amplifier is implemented to generate a differential output and the two terminals providing the differential output are coupled as inputs to a replica rectifier circuit, having electrical characteristics similar to the original rectifier circuit. One of the outputs of the amplifier provides a measure of the power of the input signal.

20 Claims, 10 Drawing Sheets

MEASURING POWER OF ANALOG SIGNALS

BACKGROUND OF THE INVENTION

1. Field of the Invention

The present invention relates to the design of integrated circuits, and more specifically to a method and apparatus for measuring power of analog signals.

2. Related Art

Integrated circuits are often designed to process analog signals. For example, a cell phone operating using GSM or CDMA may contain integrated circuits to amplify analog signals representing voice, and transmit voice encoded signals at radio frequencies (greater than 800 MHz).

It is often desirable to measure the power of analog signals. Power generally refers to the strength of the analog signals, and the measurement may be used in several ways. For example, it may be desirable to measure the power of analog signals in an integrated circuit such that the strength of the eventual signals transmitted may be controlled to be within a desired range. Such control provides several benefits, for example, protection of devices from damage due to extra power, optimizing power consumption, etc.

Power of an analog signal may be measured by root mean square (RMS) of the voltage. Various approaches are known in the prior art to measure the power of the analog signals. In one prior approach, diodes or transistors are used to rectify an input analog signal and a filter is used to average the rectified signal. The output of the filter represents the power level of the input analog input signal.

In general, the accuracy of representation of power level at the output of the filter depends on the extent of ideal characteristics exhibited by the components (rectifiers and filters) exhibiting the corresponding. However, components generally deviate from ideal characteristics, and the degree of variation depends on various factors such as ambient temperatures, imperfections in manufacturing processes, etc.

For example, a rectifier (diode or transistors, in the above description) may exhibit non-linear characteristics, and pass through both positive and negative peaks of the low amplitude input signals, resulting in improper rectification. As an illustration, if both positive and negative peaks are passed through, the average of the rectified signal would equal zero, thereby not representing the correct power level.

Even for high amplitude signals, a part of negative peak may pass through such a rectifier circuit, which also results in improper averaging of the rectified signal. At least due to the erroneous results caused, such an approach may be undesirable in several environments.

In an alternative approach, the signals with low amplitude are amplified to a desired amplitude level prior to rectification such that only positive peaks are passed through and at least most of the negative peaks are not passed through a rectifier circuit. One problem with such an approach is that the cost and board space (assuming the integrated circuit is placed on a board) are increased due to the pre-amplification requirement.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

An embodiment according to an aspect of the present invention contains a replica rectifier circuit having similar electrical characteristics as an original rectifier circuit. The original rectifier circuit receives an input analog signal, the power of which has to be measured. An input voltage is applied to the replica rectifier circuit and the input voltage is adjusted until the output of the replica rectifier circuit is equal to the output of the original rectifier circuit. Since the replica rectifier circuit and the original rectifier circuit have similar electrical characteristics, and their outputs are same, the inputs provided to the two circuits may need to be proportional Therefore, the input voltage provides a measure of the power level of the input analog signal.

In addition, replica rectifier circuit compensates for several errors in the original rectifier circuit. The errors may be due to the non-linear characteristics of the device, process, and temperature variations. Any errors in the rectification of the original rectifier circuit would also be present in the replica rectifier circuit and hence the outputs of the two rectifier circuits are also generated with the same error. Accordingly, the input voltage at the rectifier would accurately represent the power of the input analog signal irrespective of errors in the operation of the original rectifier circuit.

A feed back amplifier may be used to (almost) equalize the outputs of the two rectifier circuits. In an embodiment, the outputs of the two rectifier circuits are provided as inputs to the feedback amplifier, and the outputs of the amplifier are provided as inputs to the replica rectifier circuit. The feed back amplifier adjusts the input voltage to the replica rectifier circuit based on the difference between the outputs of the rectifier circuits until the outputs of the two rectifier circuits are substantially/almost equal.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

Figure 1A:
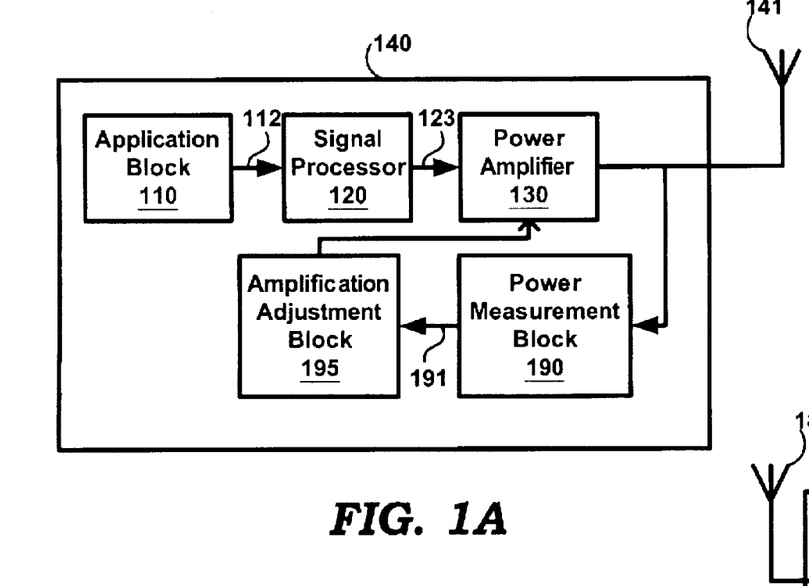
FIG. 1A is a block diagram of an example transmitter device in which the present invention can be implemented.
Figure 1B:
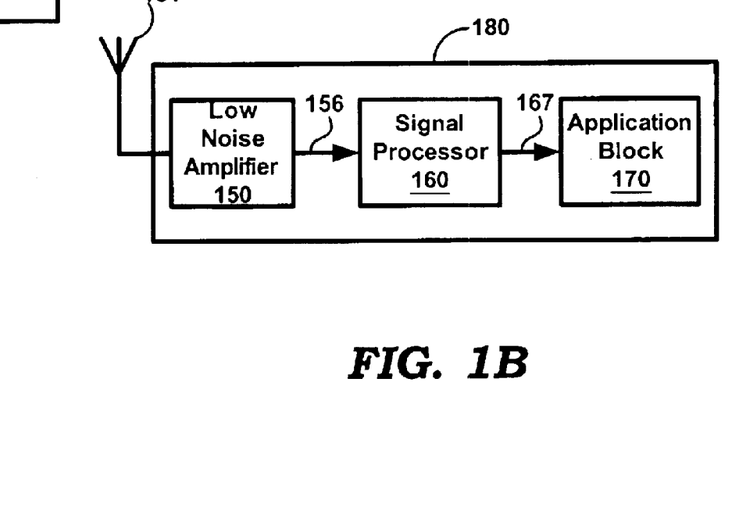
FIG. 1B is a block diagram of an example receiver device in which the present invention can be implemented.

FIGS. 1A and 1B together depict an example environment in which the present invention can be implemented. The environment is shown containing transmitter system 140 and receiver system 180 in FIGS. 1A and 1B respectively. For illustration, it is assumed that the two systems are implemented with GSM (Global System for Mobile Communication) or CDMA (Code Division Multiple Access) standard. However, the systems can be implemented using other standards and technologies (e.g., WLAN) as well. Each system is described in detail below.

Transmitter system 140 transmits analog signals (e.g. signals at radio frequencies for GSM or CDMA applications) using antenna 141. Transmitter system 140 is shown containing application block 110, signal processor 120, power amplifier 130, power measurement block 190, and amplification adjustment block 195. The components are described in detail below.

Application block 110 generates or receives digital data elements, which are encoded in the signals eventually transmitted by antenna 141. The digital data elements are provided on path 112. Signal processor 120 converts the digital data elements on path 112 into analog signals, and amplifies the analog signal to a suitable level for further processing. Application block 110 and signal processor 120 may be implemented in a known way.

Power amplifier 130 receives the analog signal on path 123 and amplifies the power level of the signal to a suitable level for transmission through antenna 141. Power measurement block 190 may measure the power level of the amplified analog signal according to an aspect of the present invention, and provide a signal/data representing the measurement on path 191. The measured value may be provided to signal processor 120 also (connection not shown) to control the overall amplification. The manner in which the power may be measured is described in sections below with examples.

Amplification adjustment block 195 adjusts the amplification factor of power amplifier 130 to obtain a desired power level in response to the data/signal received on path 191. In an embodiment, power measurement block 190 and amplification adjustment block 195 are integrated with power amplifier 130 (into a single integrated circuit) to control/regulate the power level of the analog signal to be transmitted. The amplified signals are transmitted by antenna 141.

Receiver system 180 receives the analog signal transmitted by antenna 141 using another antenna 181. Receiver system 180 is shown containing low noise amplifier (LNA) 150, signal processor 160 and application block 170. Each component is described below.

LNA 150 receives the signal from antenna 181 generally with low strength as signals get attenuated while propagating from a distant source. LNA 150 amplifies the received signal to a suitable level for further processing and provides the amplified signal on path 156. LNA 150 may contain integrated blocks (not shown) similar to power measurement block 190 and amplification adjustment block 195 to measure and control the power level of the received signal from antenna 181.

Signal processor 160 receives the signal on path 156 which may contain different frequency components. Signal processor 160 may also amplify the received signal according to the power levels measured by the power measurement block, and recovers the digital data elements encoded in the received signal. The digital data elements are provided on path 167.

Application block 170 receives the digital data elements on path 167 and uses the data elements to execute a user application. Application blocks 170 and 110 may be implemented in a known way. In general, the embodiment(s) of above are described with reference to transmitting digital data elements, however various devices can be implemented to transmit analog signals (e.g., voice) without departing from the scope and spirit of the present invention.

As noted above, power measurement block 190 measures the power level of the transmitted analog signals. The manner in which the power level of analog signals may be measured is described below with reference to FIG. 2.

3. Power Measurement Block

Figure 2:
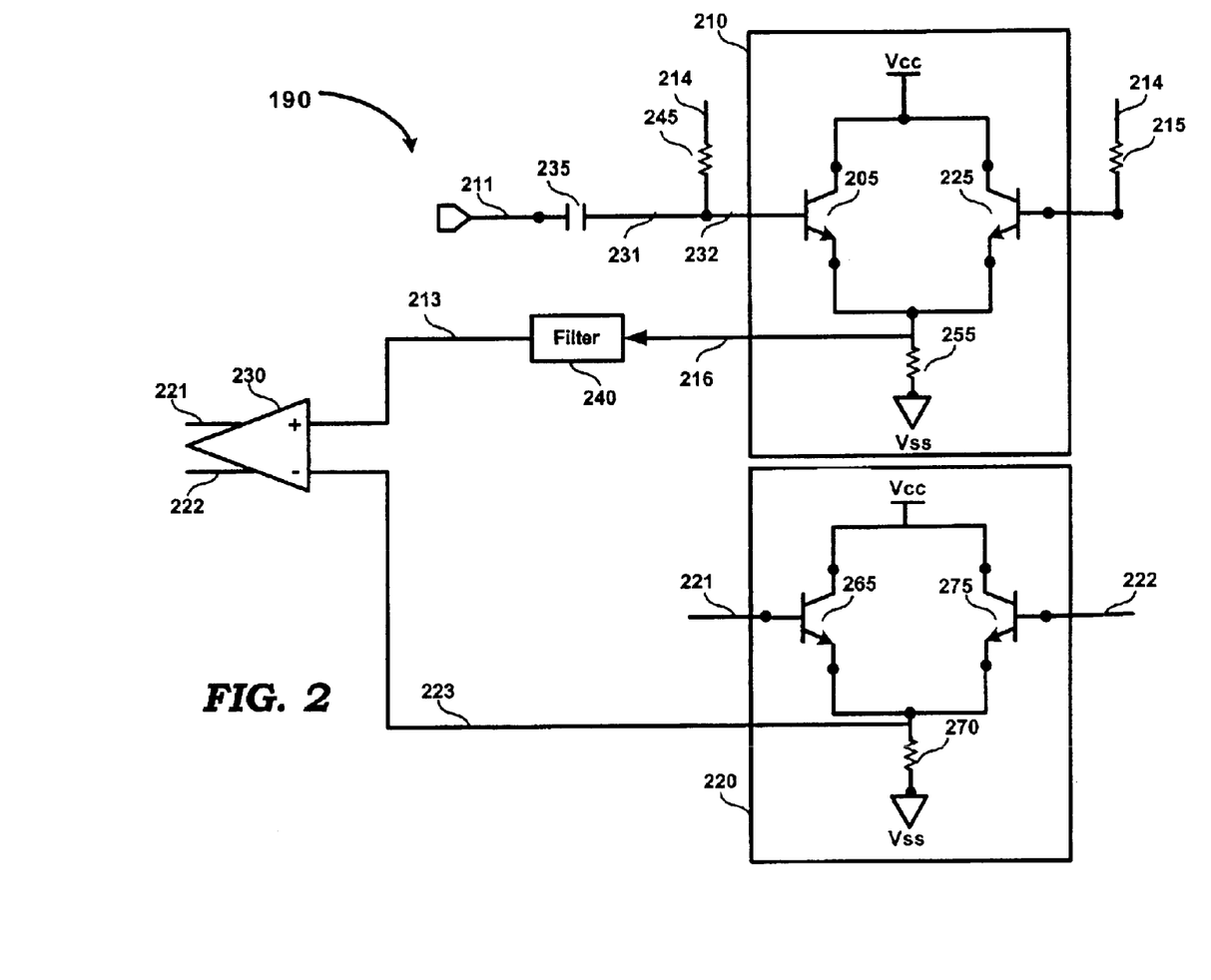
FIG. 2 is a circuit diagram illustrating the details of a power measurement block circuit according to an aspect of the present invention.

FIG. 2 is a circuit diagram illustrating the details of power measurement block 190 in an embodiment of the present invention. Power measurement block 190 is shown implemented using bipolar transistors for illustration. However, power measurement block 190 can be implemented with other components (for example, MOS transistors) without departing from the scope and spirit of several aspects of the present invention, as will be apparent to one skilled in the relevant arts by reading the disclosure provided herein.

Power measurement block 190 is shown containing original rectifier circuit 210, replica rectifier circuit 220, feed back amplifier 230, capacitor 235, resistors 215 and 245, and filter 240. Original rectifier circuit 210 in turn is shown containing transistors 205 and 225, and resistor 255. Replica rectifier circuit 220 in turn is shown containing transistors 265 and 275, and resistor 270. Each component is described below in further detail.

Capacitor 235 blocks any D.C. components present in an input analog signal received on path 211. The resulting A.C. signal is provided on path 231. Bias voltage received on path 214 is applied on path 232 (to the gate terminal of transistor 205) via resistor 245. Thus, the signal on path 232 is a combination of the filtered analog signal generated by capacitor 235 and bias voltage applied through resistor 245. Similarly, bias voltage received on path 214 is applied to the gate terminal of transistor 225 through resistor 215.

Original rectifier circuit 210 rectifies the signal on path 232 and provides the rectified analog signal on path 216. The output of original rectifier circuit 210 on path 216 may not represent an ideal rectified signal, for example, as part of negative peaks of the input analog signal may be presented on path 216 due to errors (deviation from ideal characteristics) in original rectifier circuit 210 for reasons noted above. The operation of original rectifier circuit 210 is described in further detail with reference to the components forming original rectifier circuit 210.

With respect to the components forming original rectifier circuit 210, transistor 205 may be turned off when no input signal is received on path 211 by choosing the bias voltage on path 214 to provide slightly less than a threshold voltage which turns on transistor 205. When positive (voltage greater than 0) component of an input signal is received on path 211, the signal provided on path 232 turns on transistor 205, causing the positive component to pass through. In addition, the bias voltage component (applied due to path 214) less a small voltage (approximately 0.8 V in an embodiment) drop across base and emitter junction of transistor 205, is also passed on path 216.

When a negative component is received, transistor 205 may be turned off, thereby blocking the negative component. Accordingly, transistor 205 acts as a rectifier.

Transistor 225 receives a bias voltage applied on path 214 via resistor 215. Transistors 225 and 205 may respectively mirror transistors 275 and 265. The bias voltage may be generated by an extra circuit (not shown) in a known way. The collector terminals of transistors 205 and 225 are connected to supply Vcc and the emitter terminals of transistors 205 and 225 are connected to ground Vss through resistor 255.

Continuing with reference to FIG. 2, filter 240 receives the rectified input analog signal on path 216 and provides the filtered output on path 213. The filtered output on path 213 represents the average rectified voltage of input analog signal 211. Therefore, the filtered output on path 213 provides a measure of the power level of the input analog signal in the ideal case.

However, in real implementation, transistor 205 may not completely cut off the negative peaks of the input analog signal due to the non-linear characteristics. A part of the negative peaks of the input analog signal may be provided on path 216. In such a situation, the filtered output on path 213 which is the average of positive peaks and a part of the negative peaks results in incorrect average value of the input analog signal. Replica rectifier circuit 220 may compensate for the errors in original rectifier circuit 210 as described below.

Replica rectifier circuit 220 is implemented with similar electrical characteristics as original rectifier circuit 210. Hence, the operation of replica rectifier circuit 220 for a similar input signal is same as original rectifier circuit 210 in the steady state. Therefore, the outputs generated by the two circuits have to be proportional for similar input signals (but one being A.C. in nature and other being D.C. in nature). Such a principle is used to determine the power of the analog signal received on path 211 as described below in further detail.

The similarity (in electrical characteristics) of components in replica rectifier circuit 220 to the components in original rectifier circuit 210 are described first. Transistors 265 and 275 are respectively similar to transistors 205 and 225. Resistor 270 is similar to resistor 255. As noted above, original rectifier circuit 210 receives as input (on path 232) which contains analog signal 211 and bias voltage 214, and generates a rectified output on path 216. Replica rectifier circuit 220 receives pos 221 and neg 222 voltages (which include bias voltages) as inputs, and generates the corresponding output on path 223.

The output of replica rectifier circuit on path 223 is generally based on input D.C voltage pos 221, as neg 222 may be blocked. Filter 240 provides the average value (on path 213) of the rectified output voltage of original rectifier circuit 210. The two inputs are compared by feedback amplifier 230 as described below.

Feedback amplifier 230 adjusts voltages pos 221 and neg 222 in an attempt to make equal the outputs on paths 213 and 223. If the outputs representing the average values of the inputs of the two circuits 210 and 220 are equal, then the inputs applied to the two circuits 210 and 220 need to be of a fixed proportion in a steady state due to the similarity of the two circuits. The fixed proportion equals ((voltage at pos 221–bias voltage at 214)/Voltage at node 232). The manner in which pos 221 and neg 222 voltages are adjusted is described below.

Feed back amplifier 230 provides negative feed back to replica rectifier circuit 220. Feed back amplifier 230 amplifies the difference of input voltages received on paths 213 and 223 to generate a differential signal using pos 221 and neg 222 terminals. In general, the difference in voltages pos 221 and neg 222 is equal to gain (of feed back amplifier 230) times the difference in voltages on paths 213 and 223.

In addition, the extent of change in pos 221 and neg 222 is equal in magnitude and opposite in polarity from bias voltage 214. Voltages pos 221 and neg 222 may be measured as a respective difference from a common mode voltage, in which case the two values of the two voltages are equal in magnitude and opposite in polarity. The common mode voltage equals half of the combined voltages pos 221 and neg 222, and is a constant value equal to bias voltage 214.

Thus, if the difference in voltages on paths 213 and 223 increases (for example as the average voltage of input signal 211 increases), pos 221 and neg 222 would respectively increase and decrease by the same amount proportionate to the increase of the difference of voltages on paths 213 and 223. The increase in pos 221 causes transistor 265 to transfer more positive voltage across resistor 270 and a decrease in neg 222 causes transistor 275 to transfer only negligibly lesser negative voltage across resistor 270 (since transistor 275 is turning off). Thus, the effective voltage across resistor 270, which is provided on path 223, is increased.

Accordingly, the increase in voltage on path 223 reduces the difference in voltages on paths 213 and 223. When the difference in voltages on paths 213 and 223 reduces, pos 221 decreases causing the effective voltage across resistor 270 to decrease, which in turn reduces the difference in voltages on paths 213 and 223. The voltages pos 221 and neg 222 are adjusted until the difference in voltages on paths 213 and 223 are almost equal.

However, the voltages on paths 213 and 223 may not be exactly equal and a small difference would exist. The equality depends on the value of gain of feed back amplifier 230. If the gain is large, the inputs on paths 213 and 223 are approximately equal and a small difference may get amplified, which may be enough to drive replica rectifier circuit 230. Thus, feedback amplifier 230 generally needs to be designed to have a large gain.

When the voltages on paths 213 and 223 are (almost) equal, the corresponding voltage pos 221 represents the power level of input signal applied to original rectifier circuit 210 on path 232. The input signal on path 232 includes the input analog signal received on path 211 and bias voltage on path 214. Therefore, the voltage that may represent the power level of input analog signal on path 211 may be obtained by subtracting the bias voltage 214 from voltage pos 221.

It may be noted that any changes in the operation of original rectifier circuit 210 may cause a change in the output on path 213. However, similar changes could also be present in replica rectifier circuit 220 due to the similarity of two circuits 210 and 220. Accordingly, both paths 213 and 223 may contain the same changes, which are canceled due to the subtraction operation of feedback amplifier 230. Thus, the power of an input signal may be measured accurately, without being affected by conditions which cause the same effect on both circuits 210 and 220.

Therefore, pos 221 may represent the correct measure of the power level of the input analog signal on path 211 even if errors (deviation from ideal characteristics) are present in original rectifier circuit 230. It should be noted that due to the implementation of above, power measurement block 190 can be implemented along with power amplifier 130 and amplification adjustment block 195 as one integrated circuit (leading to power/space savings and minimization of number of components in addition to accurate measurement). An example embodiment of the implementation of power measurement block 190 is described below.

4. Implementation

FIGS. 3A to 3H together represent a circuit diagram illustrating the implementation details of power measurement block 190 in an embodiment of the present invention. Power measurement block 190 is shown containing several modules—power down module 310, RF circuit 320, dummy rectifier circuit 330, compensation amplifier 340, dummy rectifier biasing circuit 350, RF network biasing circuit 360, current biasing circuit 370 and final reference subtractor 380. Various nodes in the figures are provided with labels to enable identification of the appropriate connections between the circuits of various figures. Each module is described in detail below.

Figure 3A:
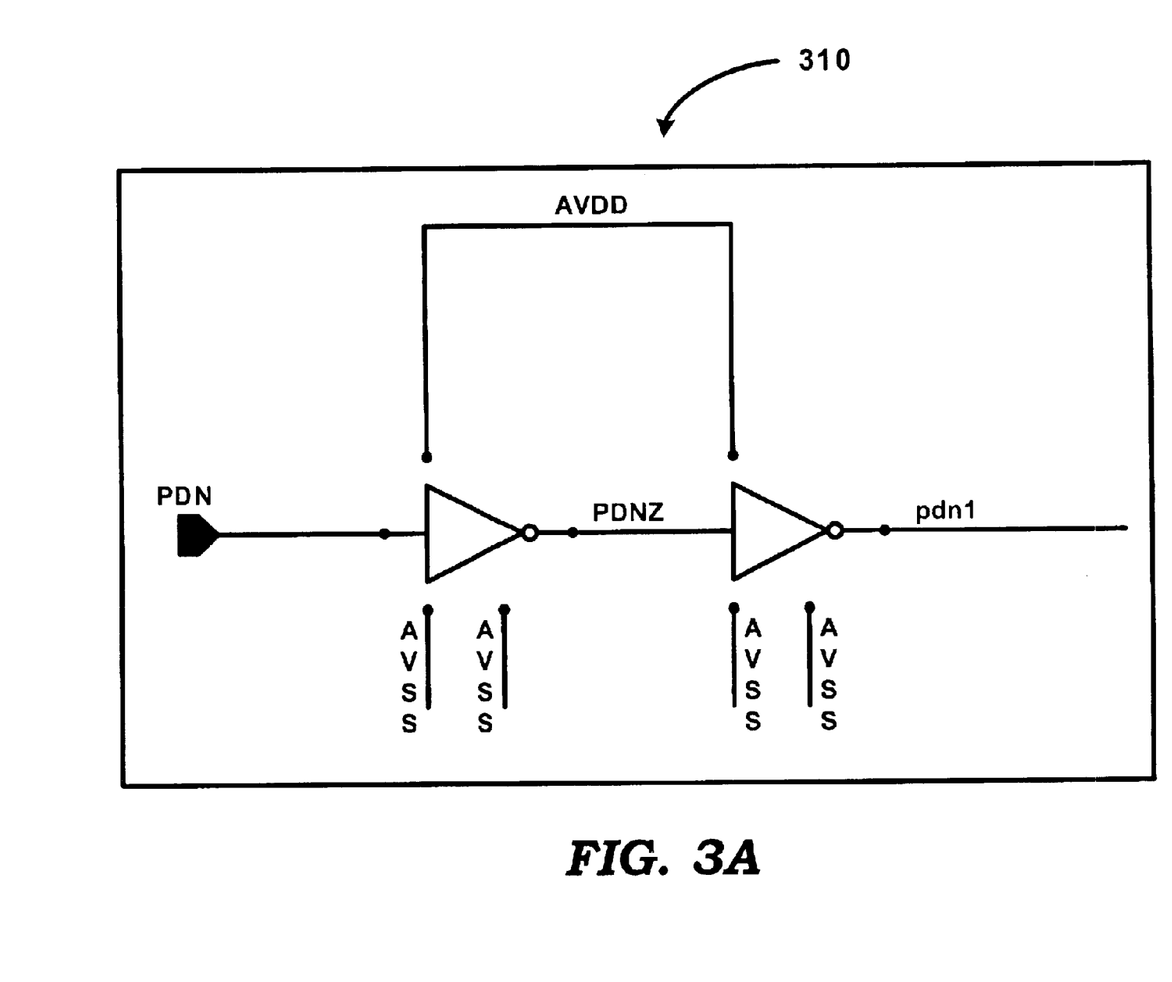
FIGS. 3A to 3H together represent a circuit diagram illustrating the implementation details of a power measurement block in an embodiment of the present invention.

Continuing with exclusive reference to FIG. 3A, which contains the details of power down module 310. Power down module 310 provides the logic signal to turn off the circuits in power measurement block 190 in non-operation mode, which may reduce the power dissipation when the circuit is not in use.

Figure 3B:
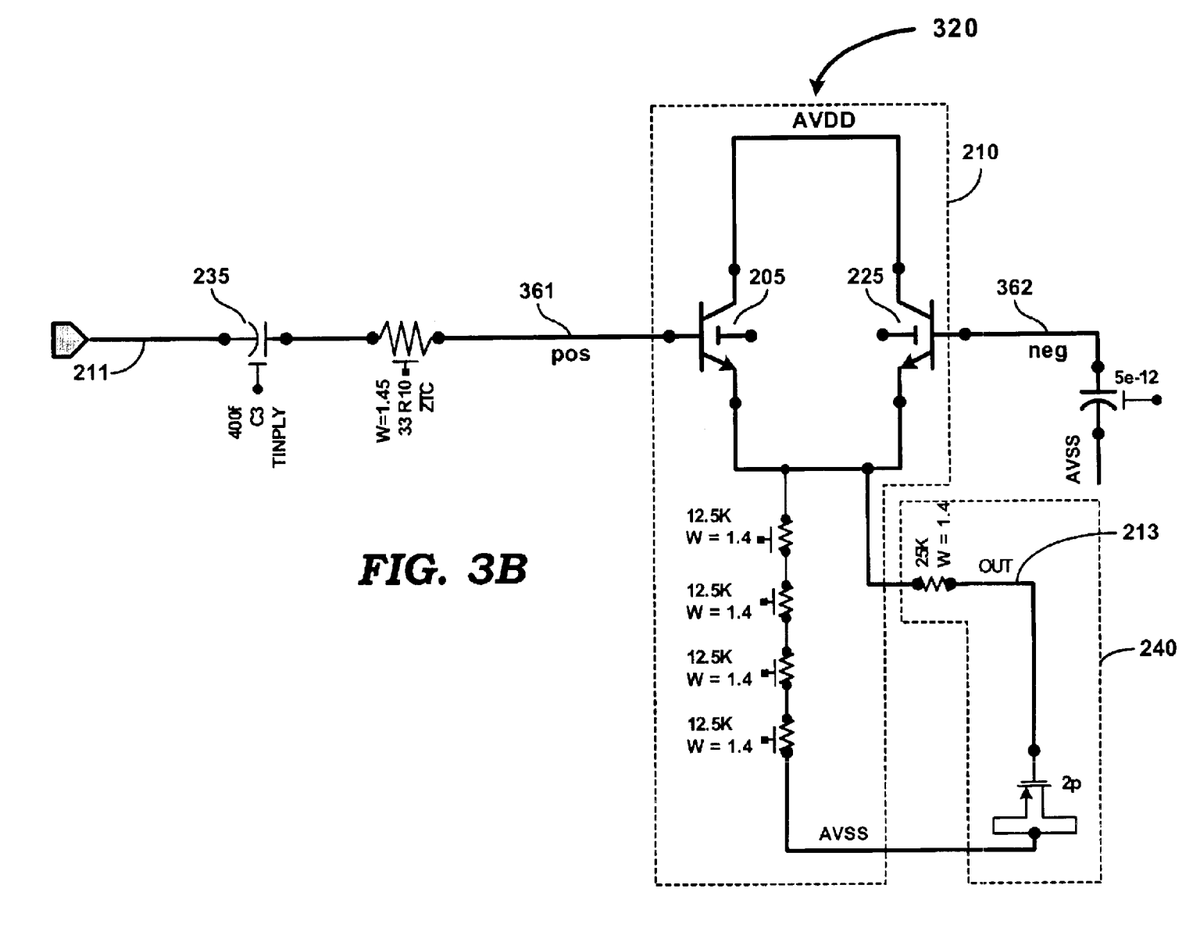

FIG. 3B is shown illustrating the details of RF circuit 320 containing original rectifier circuit 210, filter 240, capacitor 235 and other components which are required for proper operation. RF circuit 320 receives input analog signal on path 211, rectifies and filters the input analog signal. The filtered input analog signal is provided as output 'out' on path 213. RF circuit 320 receives the bias voltages on paths 361 and 362.

Figure 3C:
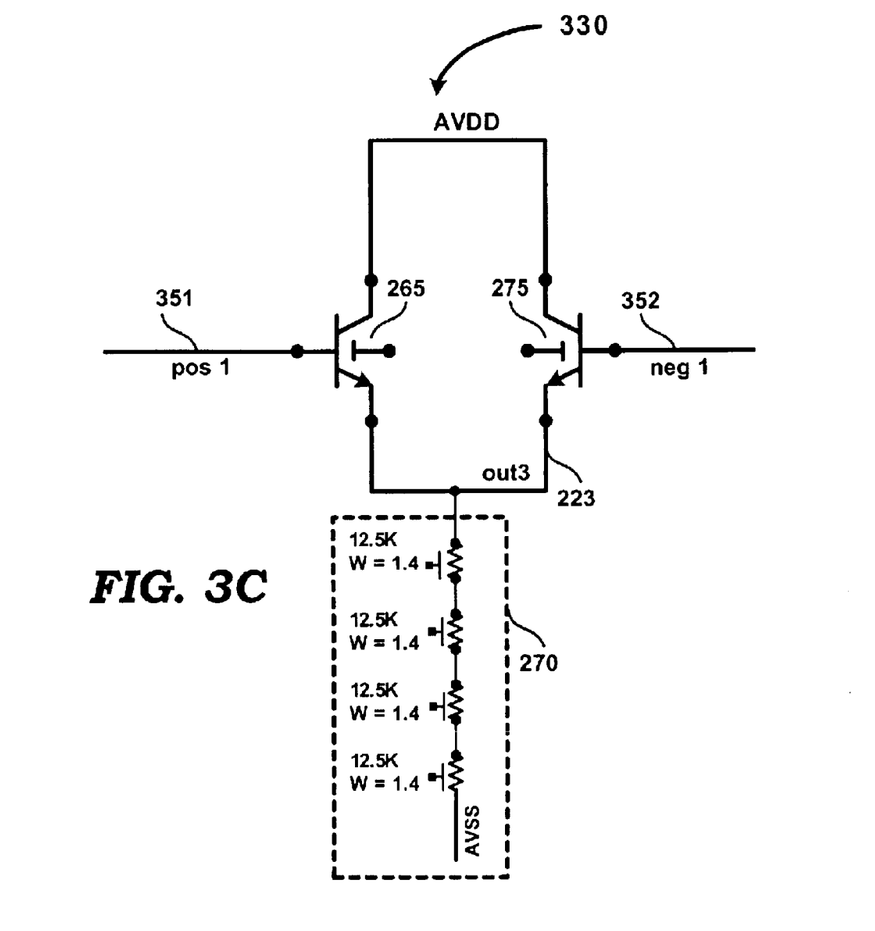

FIG. 3C is shown illustrating the details of dummy rectifier circuit 330 containing replica rectifier circuit 220. Dummy rectifier circuit 330 receives pos 1 and neg 1 respectively on paths 351 and 352, which are similar to pos 221 and neg 222 of FIG. 2. Dummy rectifier circuit 330 provides output out3 on path 223.

Figure 3D:
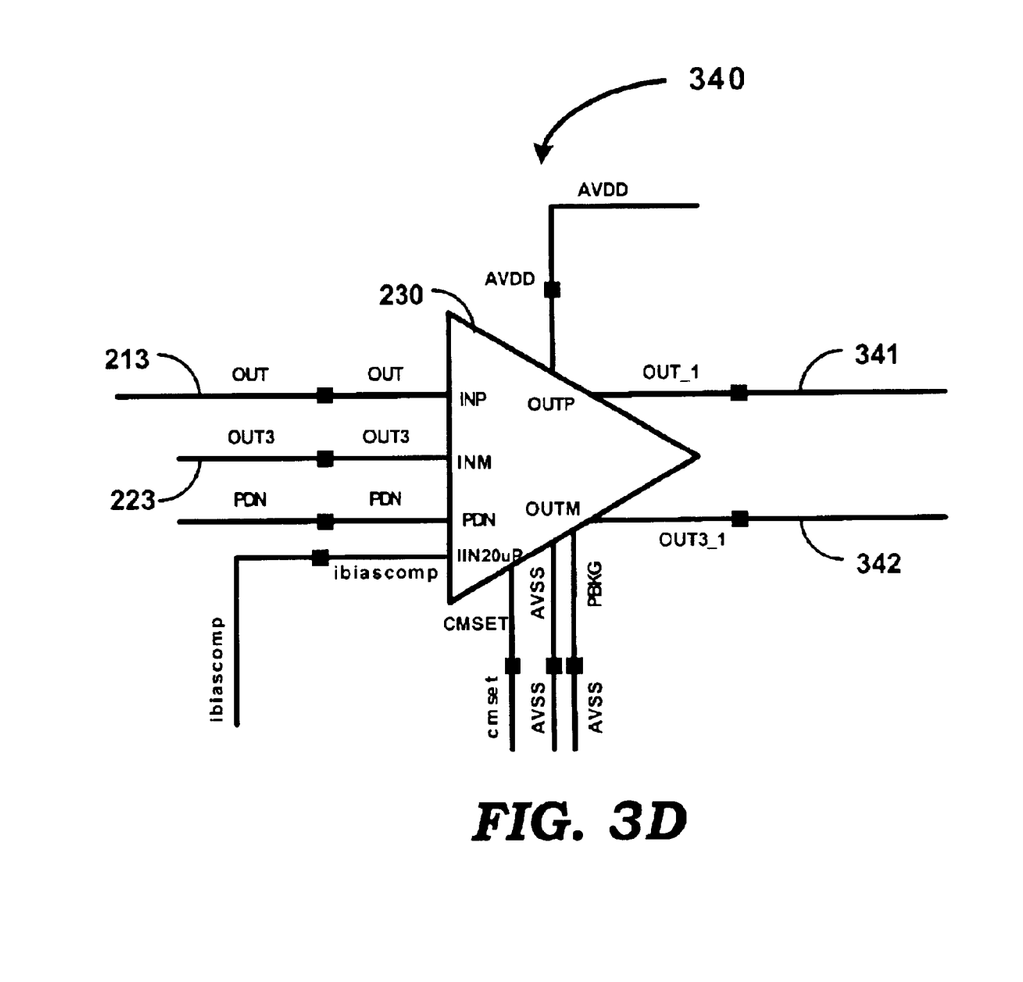

FIG. 3D is shown illustrating the details of compensation amplifier 340 containing feedback amplifier 230. Compensation amplifier 340 receives the outputs out 213 and out3 223 which are respectively generated by RF circuit 320 and dummy rectifier circuit 330. Compensation amplifier 340 generates out_1 and out3_1 respectively on paths 341 and 342 based on the difference of out 213 and out3 223.

Figure 3E:
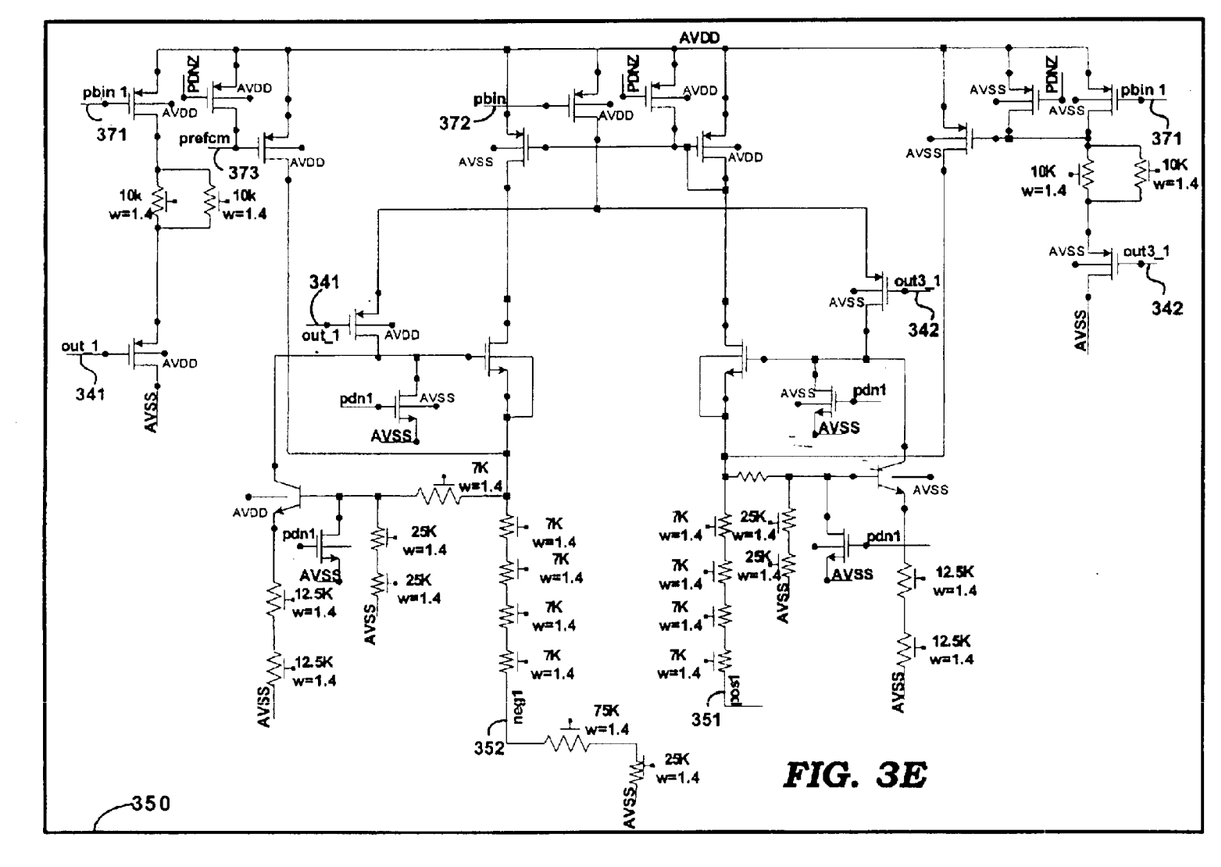

Continuing with exclusive reference to FIG. 3E, dummy rectifier biasing circuit 350 generates input voltages pos 1 351 and neg 1 352 to dummy rectifier circuit 330. Dummy rectifier biasing circuit 350 receives the required input voltages pbin1 371, pbin 372 and prefcm 373 to generate the bias voltages. However, dummy rectifier biasing circuit 350 also receives the outputs (out_1 341 and out3_1 342) of compensation amplifier 340. Dummy rectifier biasing circuit 350 generates the combination of bias voltages and outputs of compensation amplifier 340, and provides the resulting voltages pos 1 and neg 1 respectively on paths 351 and 352. Compensation amplifier 340 and dummy rectifier biasing circuit 350 together generates the pos1 351 and neg1 352 until the outputs out 213 and out3 223 are equal.

Figure 3F:
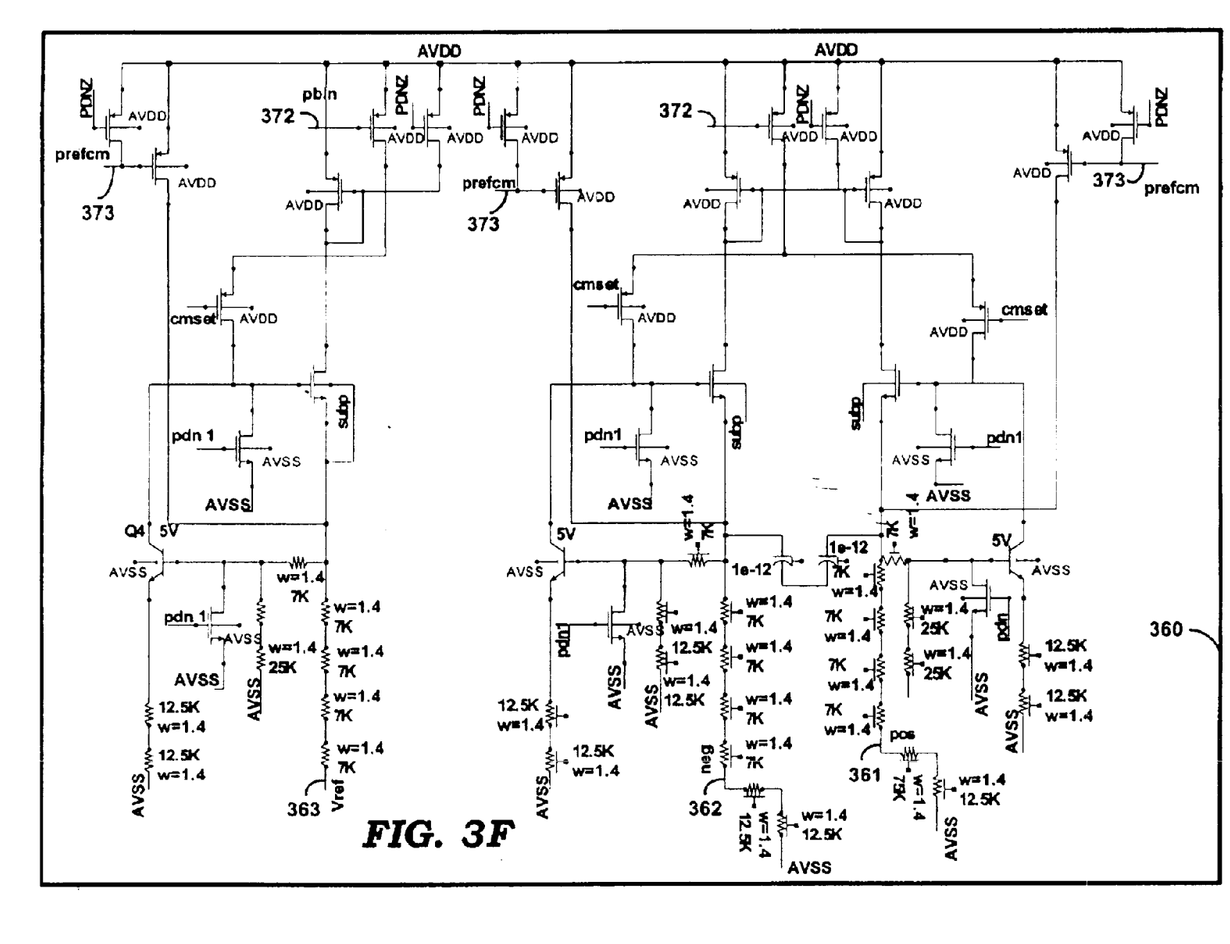

Continuing with exclusive reference to FIG. 3F, RF network biasing circuit 360 generates bias voltages to RF circuit 320. RF network biasing circuit 360 receives the required input voltages pbin 372 and prefcm 373 to generate the bias voltages pos, neg and vref respectively on paths 361, 362 and 363. The voltages pos 361 and neg 362 are used as bias voltages to RF circuit 320, and vref 363 is used as a reference bias voltage to generate the correct measure of the power level of the input analog signal 211. The bias voltages pos1 351, neg1 352, pos 361 and neg 362 may be equal to vref 363 when no input analog signal 211 is received.

Figure 3G:
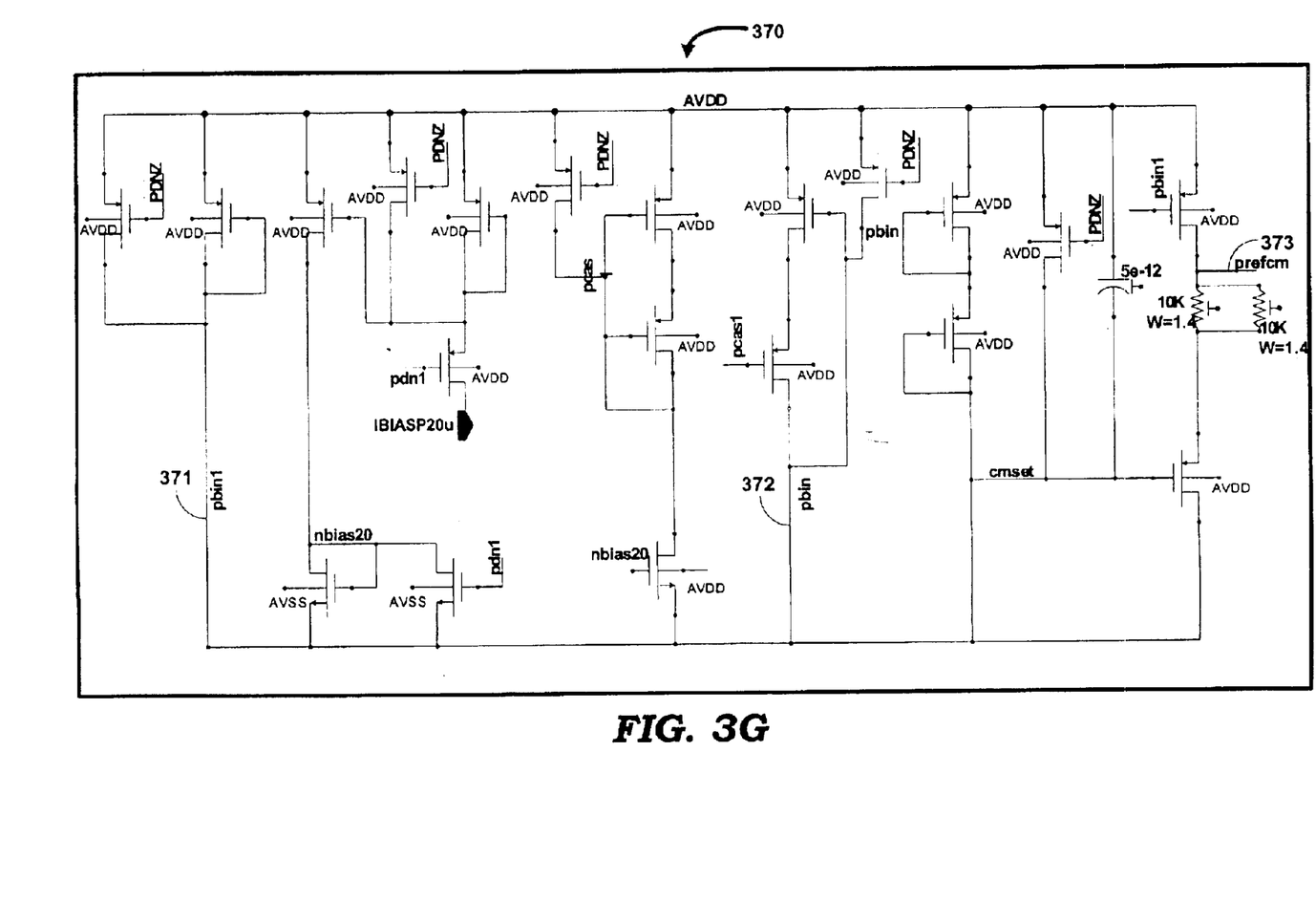

Continuing with exclusive reference to FIG. 3G, current biasing circuit 370 generates the required input voltages pbin1, pbin and prefcm respectively on paths 371, 372 and 373. The voltages pbin1 371, pbin 372 and prefcm 373 are used to set the currents required for proper functioning of RF network biasing circuit 360 and dummy rectifier biasing circuit 350.

Figure 3H:
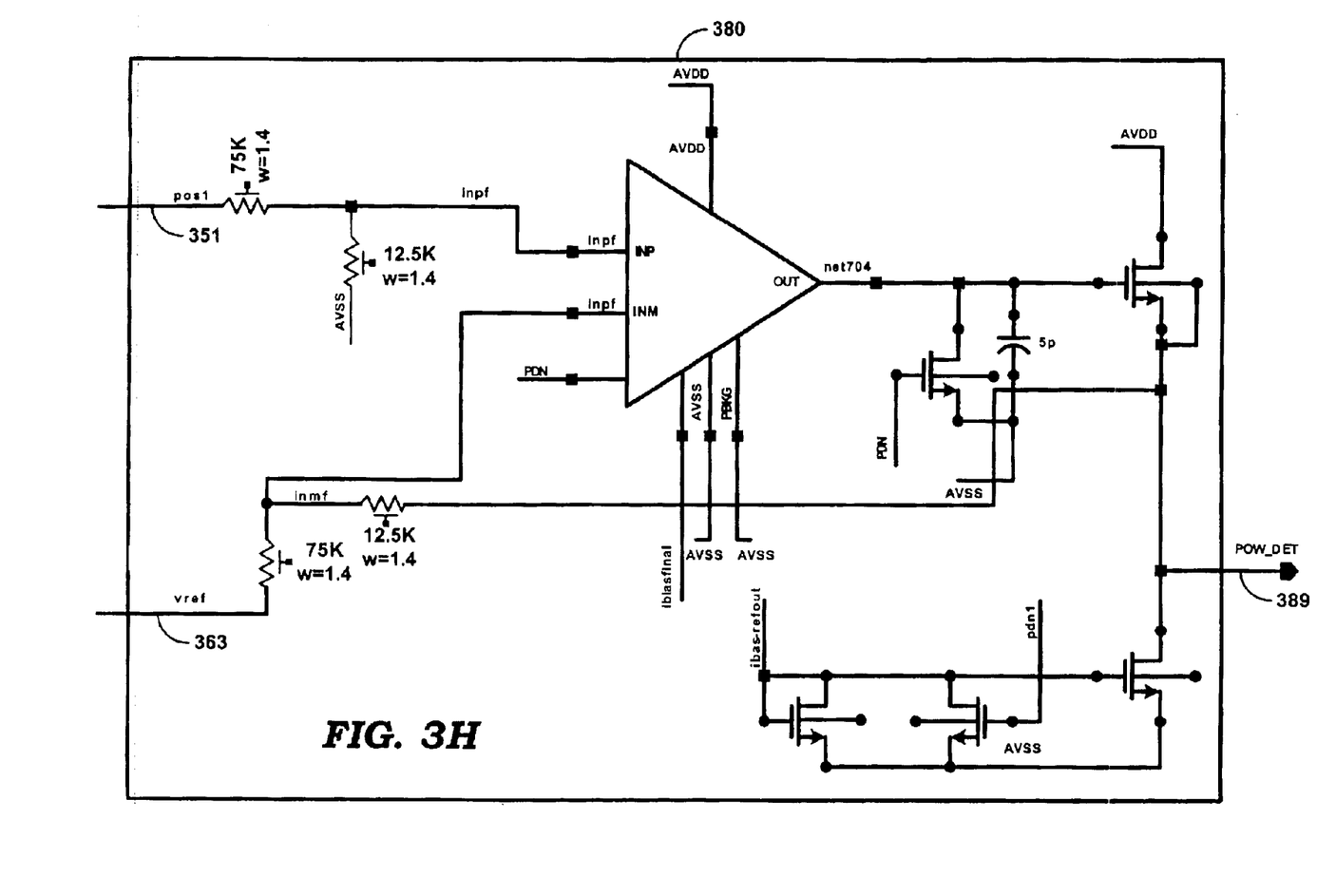

Continuing with exclusive reference to FIG. 3H, final reference subtractor 380 provides the correct measure of the power level corresponding to input analog signal 211. When the outputs out 213 and out3 223 are equal, the corresponding voltage pos1 351 represents the power level of input analog signal 211. However, the bias voltage vref 363 needs to be subtracted from pos1 351 to get the correct measure of the power output as the bias voltage is also applied to circuits 320 and 330. Therefore, the resulting value may represent the power level of input analog signal 211, which is provided on path 389.

5. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A power measurement circuit for measuring the power of an input signal, said power measurement circuit comprising:
   a capacitor receiving said input signal;
   a first resistor receiving a first biasing voltage;
   a second resistor receiving a second biasing voltage;
   an original rectifier circuit comprising:
      a first transistor containing a gate terminal, an emitter terminal and a collector terminal, said gate terminal of said first transistor being coupled to receive said input signal via said first capacitor and said first biasing voltage via said first resistor, said collector terminal of said first transistor being coupled to a first voltage level;
      a second transistor containing a gate terminal, an emitter terminal and a collector terminal, said gate terminal of said second transistor being coupled to receive said second biasing voltage via said second resistor, said collector terminal of said second transistor being coupled to said first voltage level; and
      a third resistor having a first end and a second end, said first end of said third resistor being coupled to said emitter terminal of both of said first transistor and said second transistor, said second end of said third resistor being coupled to a second voltage level;
   a filter having a first end and a second end, said first end of said filter being coupled to said first end of said third resistor;
   an amplifier having a first input terminal and a second input terminal, said first input terminal of said amplifier being coupled to said second end of said filter, said feedback amplifier generating a differential signal using a pos terminal and a neg terminal; and
   a replica rectifier circuit comprising:
      a third transistor containing a gate terminal, an emitter terminal and a collector terminal, said gate terminal of said third transistor being coupled to said pos terminal, said collector terminal of said third transistor being coupled to said first voltage level;
      a fourth transistor containing a gate terminal, an emitter terminal and a collector terminal, said gate terminal of said fourth transistor being coupled to said neg terminal, said collector terminal of said fourth transistor being coupled to said first voltage level; and
      a fourth resistor having a first end and a second end, said first end of said fourth resistor being coupled to said emitter terminal of both of said third transistor, said fourth transistor and also said second input terminal of said amplifier, said second end of said fourth resistor being coupled to said second voltage level.

2. The power measurement circuit of claim 1, wherein each of said first transistor, said second transistor, said third transistor and said fourth transistor comprises a bipolar transistor.

3. The power measurement circuit of claim 1, wherein said first biasing voltage is equal to said second biasing voltage.

4. The power measure circuit of claim 3, wherein said first biasing voltage equals a common mode voltage used to generate said differential voltage.

5. The power measurement circuit of claim 4, wherein the power of said input signal is measured by subtracting said common mode voltage from the voltage on one of said pos terminal and said neg terminal.

6. A power measurement circuit to measure the power of an input signal, said power measurement circuit comprising:

an original rectifier circuit comprising a first transistor to rectify an input signal to generate a rectified input signal, said original rectifier circuit also comprising a second transistor biased by a corresponding biasing signal to generate a second output;

an amplifier amplifying a difference of a first input and a second input to generate a differential signal, said first input being coupled to receive said rectified input signal, said differential signal being generated on a pos output and a neg output; and a replica rectifier circuit comprising a third transistor and a fourth transistor, a gate terminal of said third transistor and said fourth transistors respectively being coupled to said pos output and said neg output.

7. The power measurement circuit of claim 6, further comprising a filter generating an average signal of said rectified input signal and said second output, said average signal being provided on said first input of said amplifier.

8. The power measurement circuit of claim 6, wherein each of said first transistor, said second transistor, said third transistor and said fourth transistor comprises a bipolar transistor.

9. The power measurement circuit of claim 6, wherein said corresponding biasing voltage equals a common mode voltage used to generate said differential signals.

10. The power measurement circuit of claim 9, wherein said common mode voltage also equals a biasing voltage used to bias said first transistor.

11. The power measurement circuit of claim 10, wherein the power of said input signal is measured by subtracting said common mode voltage from the voltage on one of said pos terminal and said neg terminal.

12. A system comprising:

an application block;

a signal processor coupled to said application block;

an amplifier coupled to said signal processor, said amplifier amplifying a first analog signal to generate a second analog signal by an amplification factor;

an amplification adjustment block receiving signals representing power of a measured signal and adjusting said amplification factor according to said signals representing power;

a power measurement circuit measuring the power of a measured signal and generating said signals representing power, said power measurement circuit comprising:

an original rectifier circuit comprising a first transistor to rectify a measured signal to generate a rectified measured signal, said original rectifier circuit also comprising a second transistor biased by a corresponding biasing signal to generate a second output;

a filter generating an average signal of said rectified measured signal and said second output;

an amplifier amplifying a difference of a first input and a second input to generate a differential signal, said first input comprising said average signal, said differential signal being generated on a pos output and a neg output; and a replica rectifier circuit comprising a third transistor and a fourth transistor, a gate terminal of said third transistor and said fourth transistors respectively being coupled to said pos output and said neg output.

13. The system of claim 12, wherein each of said first transistor, said second transistor, said third transistor and said fourth transistor comprises a bipolar transistor.

14. The system of claim 12, wherein said amplification adjustment block, said amplifier and said power measurement circuit are implemented using a single integrated circuit.

15. The invention of claim 12, wherein said system comprises a receiver system, and wherein said measured signal comprises said first analog signal.

16. The invention of claim 12, wherein said system comprises a transmitter system, and wherein said measured signal comprises said second analog signal.

17. The system of claim 16, wherein said power measurement circuit further comprises a filter generating an average signal of said rectified input signal and said second output, said average signal being provided on said first input of said amplifier.

18. The system of claim 12, wherein said corresponding biasing voltage equals a common mode voltage used to generate said differential signals.

19. The system of claim 18, wherein said common mode voltage also equals a biasing voltage used to bias said first transistor.

20. The system of claim 19, wherein the power of said input signal is measured by subtracting said common mode voltage from the voltage on one of said pos terminal and said neg terminal.

* * * * *